United States Patent
Ahmad

(10) Patent No.: US 6,833,513 B1
(45) Date of Patent: Dec. 21, 2004

(54) CROSSTALK REDUCTION IN A PWB CONNECTOR FOOTPRINT

(75) Inventor: Bilal Ahmad, San Jose, CA (US)

(73) Assignee: Cisco Technology, Inc., San Jose, CA (US)

(*) Notice: Subject to any disclaimer, the term of this patent is extended or adjusted under 35 U.S.C. 154(b) by 305 days.

(21) Appl. No.: 10/279,191

(22) Filed: Oct. 22, 2002

(51) Int. Cl.[7] .................................................. H05K 7/06
(52) U.S. Cl. ...................... 174/262; 174/261; 361/777; 361/780
(58) Field of Search ............................... 174/261–265; 361/777, 780, 794

(56) References Cited

U.S. PATENT DOCUMENTS

| | | | | |
|---|---|---|---|---|
| 5,686,764 A | * | 11/1997 | Fulcher | 257/778 |
| 5,847,936 A | * | 12/1998 | Forehand et al. | 361/794 |
| 6,479,758 B1 | * | 11/2002 | Arima et al. | 174/260 |
| 6,521,846 B1 | * | 2/2003 | Freda et al. | 174/260 |

OTHER PUBLICATIONS

"VHDM Connector, Teradyna Connector Systems Division, Product Literature" <URL: http://www.teradyne.com/prods/tcs/products/connectors/backplane/vhdm/index.html>.

* cited by examiner

*Primary Examiner*—John B. Vigushin
(74) *Attorney, Agent, or Firm*—Charles E. Krueger

(57) ABSTRACT

A modified connector footprint on a PWB includes a row of ground vias disposed outside a standard connector footprint that do not mate to pins in the connector. The extra ground vias provide additional shielding and reduce cross-talk in the connector/PWB interface.

5 Claims, 4 Drawing Sheets

US 6,833,513 B1

CROSSTALK REDUCTION IN A PWB CONNECTOR FOOTPRINT

BACKGROUND OF THE INVENTION

Computer systems and other electronic equipment are commonly partitioned into subsystems on discrete Printed Wiring Boards (PWBs). These building blocks are typically multi-layer boards with discrete layers dedicated to signal, power and ground. Consequently, vias or plated through-holes (PTHs) are commonly used to connect signal traces from one layer of a PWB to another for connection to devices or other PWBs.

A connector is used to couple PWBs with one type of connector being a through-hole connector that utilizes pins which plug into the vias to connect to signal traces and ground traces on the PWB. The vias on the PWB are arranged in a pattern, called a connector footprint, the dimensions of the vias and the spacing between the vias are arranged to correspond to the arrangement of pins on the connector so that the pins of the connector can be plugged into the vias of the connector footprint. The connector footprint includes signal and ground vias which receive, respectively, signal and ground pins of the connector.

Cross-talk is a phenomena where a signal carried in one conductor causes a disturbance to the signal carried in another conductor. The conductor which causes the disturbance is called the aggressor and the conductor which experiences the disturbance is called the victim. The disturbance is caused by electromagnetic coupling between the two conductors and becomes more pronounced at high frequencies. Various techniques for eliminating cross-talk exist including shielding to prevent the disturbance from occurring and active compensation to cancel cross-talk that has occurred in the victim.

Cross-talk in state of the art back-plane connectors is a primary limitation in the operation of serial links at speeds in excess of 5.0 Gbps. Part of this cross-talk comes from within the connector, and part of it comes from the interface between the connector and the PWB.

High speed back-plane connectors usually do a good job of shielding signals from each other within the connector. However, often times, the design of the interface between the connector and the PWB does not prevent cross-talk for certain signals. For example, the VHDM® Connector, manufactured by Teradyne. The 8-row version of this connector has an interface depicted in FIG. 1. FIG. 1 shows signal traces labeled by a row designation (A–H) and a column designation (1–N) within the Teradyne VHDM® 8-row connector. Vertical ground strips separate adjacent signal columns. The ovals represent typical grouping of signal traces to form differential pairs. The ground strips provide shielding between the signal traces.

FIG. 2 shows the transformation of connector field to the footprint on the PWB. The signal traces end in signal vias in rows A–H, while the ground strips end up as columns of ground vias. In FIG. 2 the ground vias are labeled as rows J–P. Thus, any via in the footprint can be identified by a row and column designation. Signal pins on the connector plug in to the vias on the footprint to transfer signals on the PWB to other boards or cables.

Through hole connectors like the Teradyne VHDM® exhibit a significant amount of cross-talk from the connector footprint in the outer rows, e.g., rows A and H of the 8 row VHDM® connector due to insufficient shielding.

BRIEF SUMMARY OF THE INVENTION

According to one aspect of the invention, an additional ground via is added to each end of the ground via columns in the connector interface on the PWB. The additional vias are not connected to ground pins of the connector.

According to another aspect of the invention, additional, unconnected ground vias are added to a connector interface footprint to provide additional shielding for preventing cross-talk between signal vias near the periphery of the connector footprint.

Additional features and advantages of the invention will be apparent in view of the following detailed description and appended claims.

DETAILED DESCRIPTION OF THE INVENTION

An embodiment of the invention will now be described, by way of example not limitation, with reference to the 8-row connector interface of the VHDM® connector. It is understood by persons of skill in the art that the invention is applicable to other connector footprint configurations.

Figure 1:
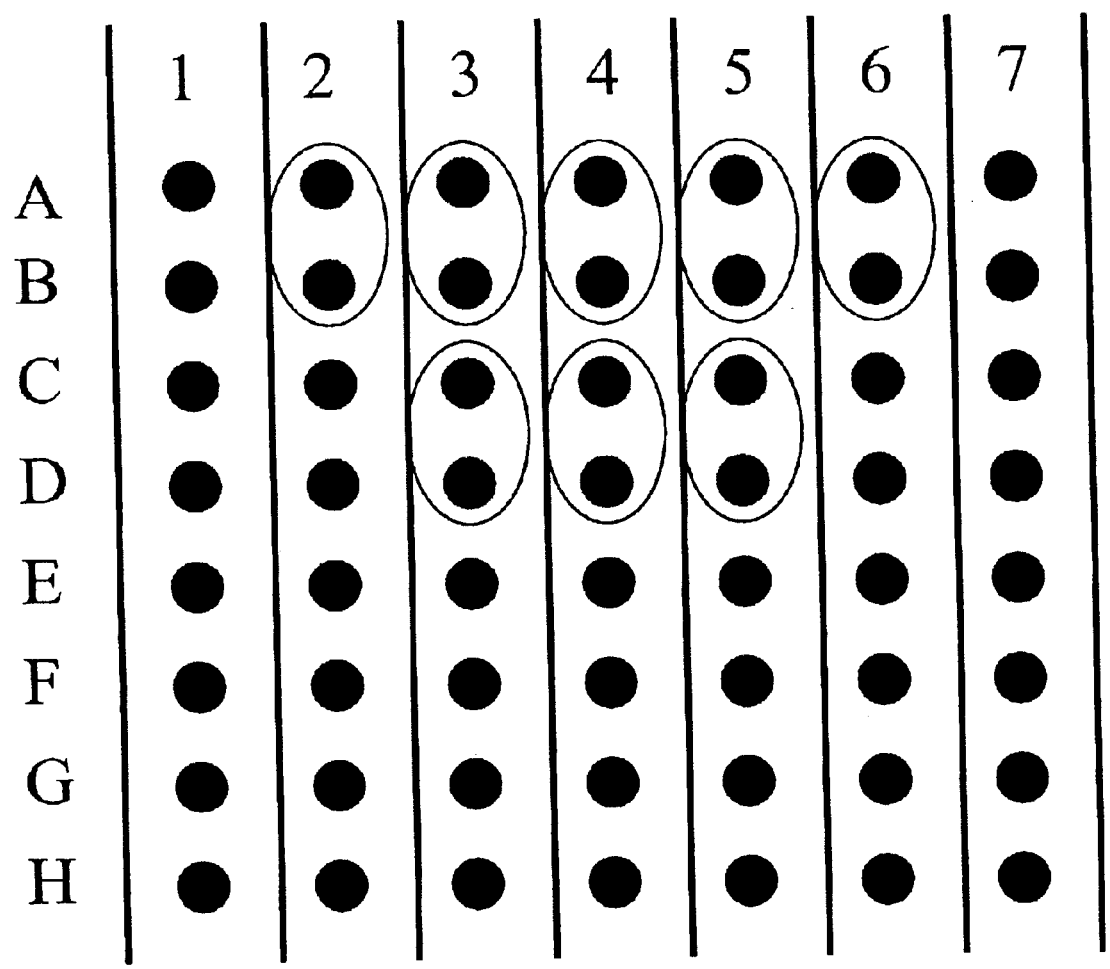
FIG. 1 is a schematic diagram depicting the signal and ground traces of a connector.
Figure 2:
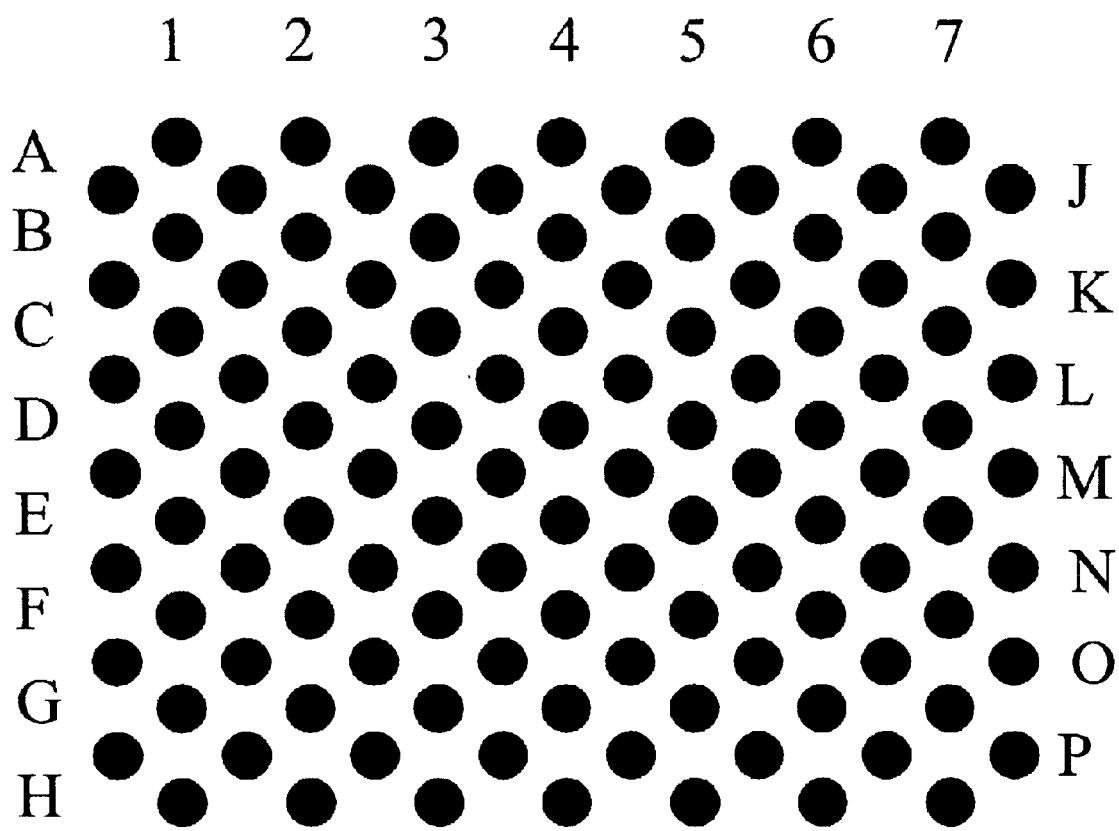
FIG. 2 is a schematic diagram depicting the interface connector PWB footprint of the connector depicted in FIG. 1.

As depicted in FIG. 2, the connector interface footprint includes signal columns including 8 vias in each signal column and only 7 Ground vias between columns. This footprint is laid out geometrically so that the correct pins of the connector can be plugged into corresponding vias of the footprint to the PWB.

However, the geometrical arrangement depicted in FIG. 2 leaves the outer signal rows, rows A and H, relatively unshielded from adjacent signals. As described above, although the connector itself does a reasonably good job of eliminating cross-talk, cross-talk still results from the interface. It has been determined that a significant portion of this cross-talk comes from lack of enough ground vias between signal vias.

Figure 3:
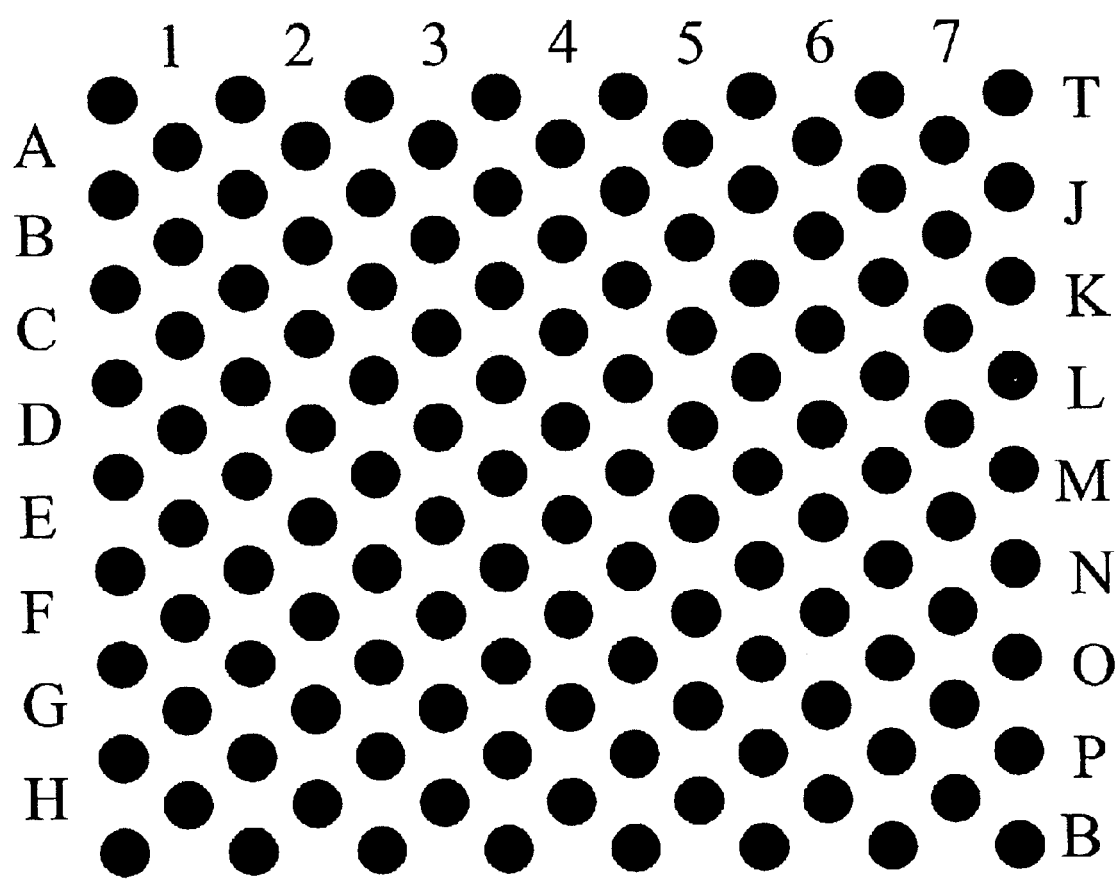
FIG. 3 is a schematic diagram of an embodiment of an enhanced interface connector PWB footprint.
Figure 4:
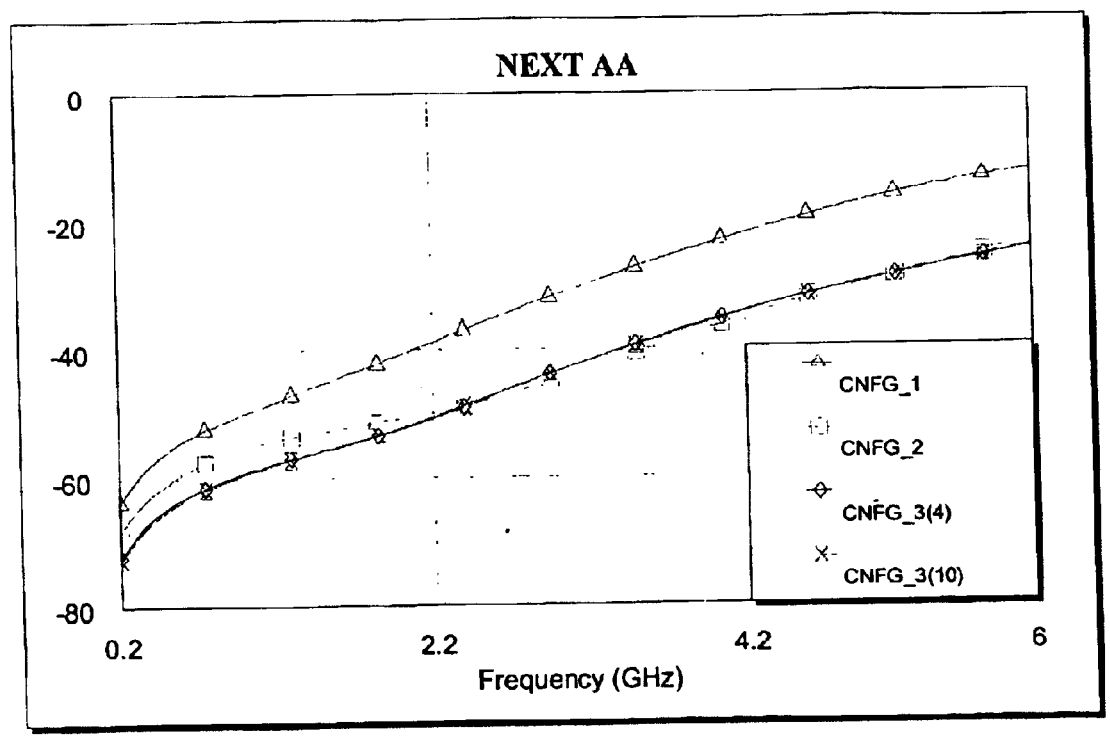
FIG. 4 is a graph illustrating cross-talk reduction due to the enhanced interface connector PWB footprint

FIG. 3 depicts an embodiment of a modified PWB connector footprint that reduces cross-talk. In the modified footprint, a first extra top row (T) of ground vias is added above row A of signal vias and a second extra bottom row (B) of ground vias is added below row H of signal vias.

The operation of the present embodiment will now be described with reference to FIGS. 2 and 3. Turning first to FIG. 2, consider signal pins A4 and B4 as victims. An aggressor of B4 is B5, however, two ground vias, J5 and KS provide shielding between B4 and B5 and substantially reduce cross-talk. On the other hand, an aggressor of A4 is A5, however, only one ground via, J5, provides shielding between A4 and A5 so that cross-talk is not attenuated as effectively as in the case of the B4, B5 victim-aggressor pair.

Turning now to FIG. 3, there are now two ground vias, TEX5 and J5 providing shielding between A4 and A5 thereby providing shielding similar to the B4, B5 pair described above.

Note that the additional rows of ground vias do not correspond to pins in the connector and are therefore not mated to the connector, the additional ground vias are, however, conductively coupled to the original connector ground pins and vias through the PWB ground planes/layers. As demonstrated below, the presence of these additional ground vias significantly reduces cross-talk.

The original connector footprint depicted in FIG. 2 and the enhanced connector footprint depicted in FIG. 3 were simulated and results for near-end cross-talk are plotted in FIG. 5. The top curve is the cross-talk between vias A4 and A5 of FIG. 2, while the bottom curve is the cross-talk between vias A4 and A5 of FIG. 3. There is a good 10 dB reduction in cross-talk due the additional ground vias.

Accordingly, an extremely elegant solution to reducing cross-talk has been described having insignificant cost and simplicity of implementation.

The invention has now been described with reference to the preferred embodiments. Alternatives and substitutions will now be apparent to persons of ordinary skill in the art. The principles of the invention can be extended to any connector footprint having signal pins disposed on the edge of the footprint. Additionally, the positions of the extra ground vias in the enhanced footprint may be adjusted to account for properties of a particular connector. Accordingly, it is not intended to limit the invention except as provided by the appended claims.

What is claimed is:

1. An enhanced cross-talk reducing connector footprint on a PWB, with the PWB including a ground layer, the enhance connector footprint for coupling a connector having ground pins arranged in columns between signal pins, said enhanced cross-talk reducing connector footprint comprising:

a standard connector footprint having signal and ground vias geometrically arranged to be congruent to the connector footprint to receive corresponding signal and ground pins of the connector, with signal vias disposed along at least a first edge of the standard connector footprint, and with the ground vias in the standard footprint for coupling connector ground pins to the ground layer of the PWB; and a first row of extra ground vias disposed outside the connector footprint and substantially parallel to the first edge of the connector footprint to provide shielding and reduce cross-talk between signal pins disposed along the first edge, where ground pins are not mated to the extra ground vias and where the extra ground vias are coupled to ground vias in the standard connector footprint and to the ground pins of the connector through the ground layer of the PWB.

2. The cross-talk reducing PWB connector interface footprint of claim 1 where:

the vias are plated through-holes.

3. The cross-talk reducing PWB connector interface footprint of claim 1 where:

the ground vias are arranged in columns disposed between columns of signal vias and rows disposed between rows of signal vias.

4. A method for reducing cross-talk between signal conductors of a PWB connector comprising the acts of:

forming a standard connector interface footprint in a PWB including ground and signal vias geometrically arranged to engage pins of a connector, with the standard connector interface including an edge row of signal vias at an outside edge; and forming a shielding row of ground vias, not corresponding to ground pins in the connector, disposed substantially adjacent to the edge row and outside the standard interface connector footprint.

5. An enhanced cross-talk reducing connector footprint on a PWB, with the PWB including a ground layer, the enhance connector footprint for coupling a connector having ground pins arranged in columns between signal pins, said enhanced cross-talk reducing connector footprint comprising:

means, formed in PWB, for coupling signal pins of the connector to signal traces on the PWB and ground pins of the connector to a ground layer on the PWB; and means, formed in the PWB and adjacent and external to the means for coupling, coupled to the ground plane in the PWB for providing addition shielding to reduce cross-talk.

\* \* \* \* \*